United States Patent [19]

Leupold

[11] Patent Number: 5,216,401
[45] Date of Patent: Jun. 1, 1993

[54] MAGNETIC FIELD SOURCES HAVING NON-DISTORTING ACCESS PORTS

[75] Inventor: Herbert A. Leupold, Eatontown, N.J.

[73] Assignee: The United States of America as represented by the Secretary of the Army, Washington, D.C.

[21] Appl. No.: 892,104

[22] Filed: Jun. 2, 1992

[51] Int. Cl.⁵ .............................................. H01F 7/02
[52] U.S. Cl. ................................................... 335/306
[58] Field of Search ............................ 335/296–306, 335/210; 315/5.34, 5.35

[56] References Cited

U.S. PATENT DOCUMENTS

| | | | |
|---|---|---|---|
| 4,614,930 | 9/1986 | Hickey et al. | 335/302 |
| 4,835,506 | 5/1989 | Leupold | 335/306 |
| 4,837,542 | 6/1989 | Leupold | 335/306 |
| 4,839,059 | 6/1989 | Leupold | 201/335 |
| 4,999,600 | 3/1991 | Aubert | 335/306 |
| 5,028,903 | 7/1991 | Aubert | 335/306 |

OTHER PUBLICATIONS

Leupold et al., *Novel High-Field Permanent-Magnet Flux Sources*, IEEE Transactions on Magnetics, vol. MAG-23, No. 5, Sep., 1987, pp. 3628–3629.

Leupold et al., *A Catalogue of Novel Permanent-Magnet Field Sources*, Paper No. W3.2, 9th International Workshop on Rare-Earth Magnets and Their Applications, 1987, Bad Soden, FRG.

Leupold, U.S. Statutory Invention Registration H591, entitled "Method of Manufacturing of a Magic Ring."

Leupold et al., "Design applications of magnetic mirrors," Journal of Applied Physics, 63(8), Apr. 15, 1988, pp. 3987–3988.

Leupold et al., "Applications of yokeless flux confinement," *Journal of Applied Physics*, 64(10), Nov. 15, 1988, pp. 5994–5996.

Abele et al., "A general method for flux confinement in permanent-magnet structures," *Journal of Applied Physics*, 64(10), Nov. 15, 1988, pp. 5988–5990.

Primary Examiner—Leo P. Picard
Assistant Examiner—Raymond Barrera
Attorney, Agent, or Firm—Michael Zelenka; William H. Anderson

[57] ABSTRACT

A permanent magnet having a shell of magnetic material and a hollow cavity. An access port passes through the shell and communicates with the cavity. The shell is permanently magnetized to produce a substantially uniform magnetic field in the cavity. The magnetization of the shell is the resultant of magnetization components M1 and M2. Components M2 are uniform in both magnitude and direction while components M1 are uniform in magnitude and nonuniform in direction. Also, components M1 and M2 are substantially equal in magnitude to each other and, in the regions adjacent the access port, are aligned in opposite directions. The shell comprises a plurality of magnetic segments and each segment is uniformly magnetized. In accordance with one embodiment, the shell and cavity are concentric spheres, and the access port includes an axial hole that passes through the spherical center. In another embodiment, the shell and cavity are spherical, and the access port is a gap that passes through the shell at its equatorial plane. In still another embodiment, the shell and cavity are cylindrical, and the access port is a narrow gap. The gap lies in a plane that includes the cylindrical axis.

11 Claims, 6 Drawing Sheets

POLAR AXIS FIELD PROFILE

AXIAL DISTANCE FROM SPHERE CENTER (cm)

MAGNETIC FIELD SOURCES HAVING NON-DISTORTING ACCESS PORTS

GOVERNMENT INTEREST

The invention described herein may be manufactured, used, and licensed by or for the Government for governmental purposes without the payment to me of any royalty thereon.

BACKGROUND OF THE INVENTION

1. Field of the Invention

The present invention relates to high-field permanent magnets. More specifically, it relates to structures and techniques for providing non-distorting access ports in magnetic field sources.

2. Description of the Prior Art

One of the most critical problems confronting designers of high-intensity magnetic field sources has been the construction of access ports in a magnet that do not distort its working field. This problem is overcome by the present invention.

More specifically, a class of conventional magnetic field sources capable of producing high-intensity uniform fields comprise a magnetic shell and a hollow cavity in which the field is located. Examples of such magnets may be found in the following references:

Leupold, U.S. Pat. No. 4,835,506, entitled "Hollow Substantially Hemispherical Permanent Magnet High-Field Flux Source;"

Leupold, U.S. Pat. No. 4,837,542, entitled "Hollow Substantially Hemispherical Permanent Magnet High-Field Flux Source for Producing a Uniform High Field;"

Leupold, U.S. Pat. No. 4,839,059, entitled "Clad Magic Ring Wigglers;"

Leupold, U.S. Statutory Invention Registration H591, entitled "Method of Manufacturing of a Magic Ring;"

Leupold et al., "Novel High-Field Permanent-Magnet Flux Sources," *IEEE Transactions on Magnetics*, vol. MAG-23, No. 5, pp. 3628-3629, September 1987; and Leupold et al., "A Catalogue of Novel Permanent-Magnet Field Sources," Paper No. W3.2, *9th International Workshop on Rare-Earth Magnets and Their Applications*, pp 109-123, August 1987, Bad Soden, FRG.

Leupold et al., "Design applications of magnetic mirrors," *Journal of Applied Physics*, 63(8), Apr. 15, 1988, pp. 3987-3988;

Leupold et al., "Applications of yokeless flux confinement," *Journal of Applied Physics*. 64(10), Nov. 15, 1988, pp. 5994-5996; and Abele et al., "A general method for flux confinement in permanent-magnet structures," *Journal of Applied Physics*, 64(10), Nov. 15, 1988, pp. 5988-5990.

Additionally, magnets of the type described herein may be found in my following copending U.S. patent applications that are incorporated herein by reference:

Ser. No. 654,476, filed Feb. 13, 1991, entitled "High-Power Electrical Machinery;"

Ser. No. 650,845, filed Feb. 5, 1991, entitled "High-Power Electrical Machinery with Toroidal Permanent Magnets;"

Ser. No. 709,548, filed Jun. 3, 1991, entitled "High-Field Permanent Magnet Flux Source;" and Ser. No. 892,093, filed concurrently herewith, entitled "Field Augmentation in High-Intensity Magnetic Field Sources,"

These references show a number of different compact permanent-magnet configurations capable of producing uniform magnetic fields of unusually high intensity. In general, these magnets include a shell of magnetic material and a cavity in which the field is located. Access ports of various sizes, shapes and locations pass through the shell and communicate with the cavity. Depending on the configuration of the access ports, the field in the cavity, which is typically used as a working field, is subjected to distortions of varying degrees. When such magnets are used in applications requiring high-precision fields, these distortions are often unacceptable.

Consequently, those concerned with the development of devices requiring the use of high-precision magnets, such as Faraday rotators, extended interaction amplifiers, wigglers, traveling-wave tubes, and the like, have long recognized the need for structures and techniques that provide non-distorting access ports to a working magnetic field. The present invention fulfills this need.

SUMMARY OF THE INVENTION

The general purpose of this invention is to provide a high-intensity, permanent-magnet flux source having access ports that do not significantly effect the uniformity of a working magnetic field. To attain this, the present invention contemplates a magnet having a shell of magnetic material with a hollow cavity and an access port that passes through the shell and communicates with the cavity. The shell is permanently magnetized to produce a substantially uniform magnetic field in the cavity. The remanence or remanent magnetization of the shell is the resultant of magnetization components M1 and M2 in which components M2 are uniform in both magnitude and direction while components M1 are uniform in magnitude and nonuniform in direction. Also, the components M1 and M2 are substantially equal in magnitude to each other and, in the regions adjacent the access port, they are aligned in opposite directions.

According to one aspect of the invention, the shell and the cavity are concentric spheres and the access port is an axial hole that passes through the spherical center of the shell along a polar axis. According to another aspect of the invention, the access port includes a narrow, ring-shaped gap that passes through the shell at its equator. In still another aspect of the invention, the shell and cavity are concentric cylinders having an access port that is a narrow gap that lies in a plane of the cylinder axis.

The exact nature of this invention, as well as other objects and advantages thereof, will be readily apparent from consideration of the following specification relating to the annexed drawing.

DETAILED DESCRIPTION OF THE PREFERRED EMBODIMENTS

Figure 1:
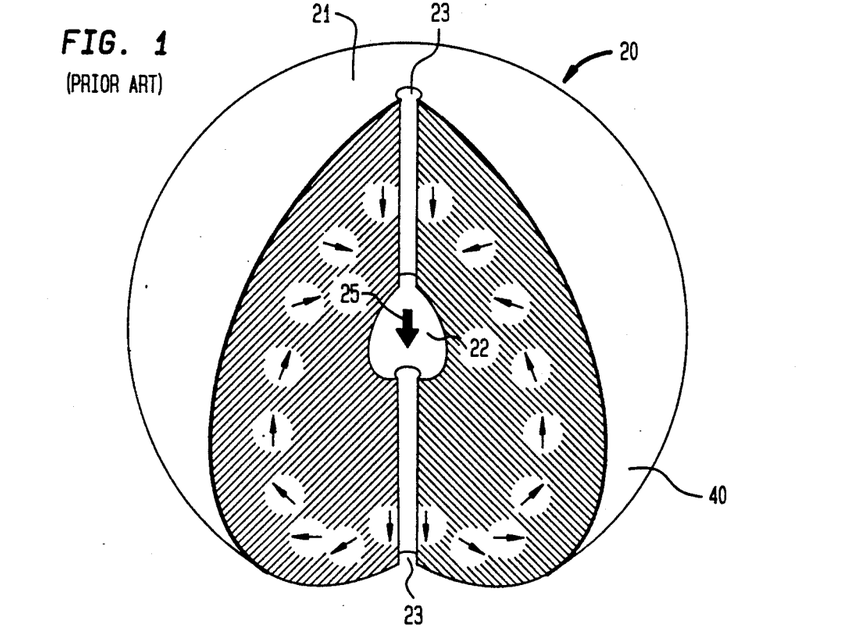
FIG. 1 is a pictorial view in cross section of an idealized prior-art magnet of a "magic-sphere" type.

Referring now to the drawings, there is shown in FIG. 1 a high-field permanent magnet 20 having a spherical shell 21 and a concentric spherical cavity 22. The FIG. 1 illustration depicts magnet 20 in pictorial form with a ninety-degree portion of spherical shell 21 cut away to reveal the cross-sectional shapes of shell 21 and inner cavity 22. Narrow, cylindrical access ports 23 are shown aligned with the spherical center and extending coaxially through spherical shell 21 on opposite sides of cavity 22 along a polar axis. Ports 23 are of sufficient size to permit access to cavity 22.

A "magic sphere" similar to the magnet 20 is described in detail in the Leupold ,542 patent, cited above. Briefly, shell 21 is composed of magnetic material that is permanently magnetized in a direction such that the remanence varies continuously with a polar angle, where the longitudinal axis of aligned ports 23 is the polar axis and the spherical center of shell 21 is the pole.

The thin arrows in FIG. 1, and elsewhere in the drawings, depict the intensity and polarization directions of the remanent magnetization of the magnetic material at the locations indicated. Thick arrow 25 in FIG. 1 represents a uniform working field in cavity 22. There is also a significant field exterior of magnet 20 as well as a field in access ports 23.

It is noted that access ports 23 are arranged to accommodate a utilization means (not shown) which interacts with the working field. Such utilization means may be a dielectric specimen, electrical conductors, a wave guide, an electromagnetic beam or a charged particle beam.

Magnet 20 is an idealized configuration of a "magic sphere." Magnet 20 is considered ideal because it is shown with a continuously varying magnetization orientation. Specifically, the polarization of the magnetization varies continuously as a function of the polar angle while the intensity remains constant. Theoretically, this configuration produces a perfectly uniform field in cavity 22 if access ports 23 are ignored. In practice, however, the ideal magnetization configuration is difficult to achieve and is usually closely approximated by use of a segmented configuration.

The addition of access ports 23 usually has a significant impact on the uniformity of a working field. For example, field distortions are often quite significant for port diameters that are a quarter that of the cavity diameter. In some applications, even smaller port diameters are unacceptable.

Figure 2:
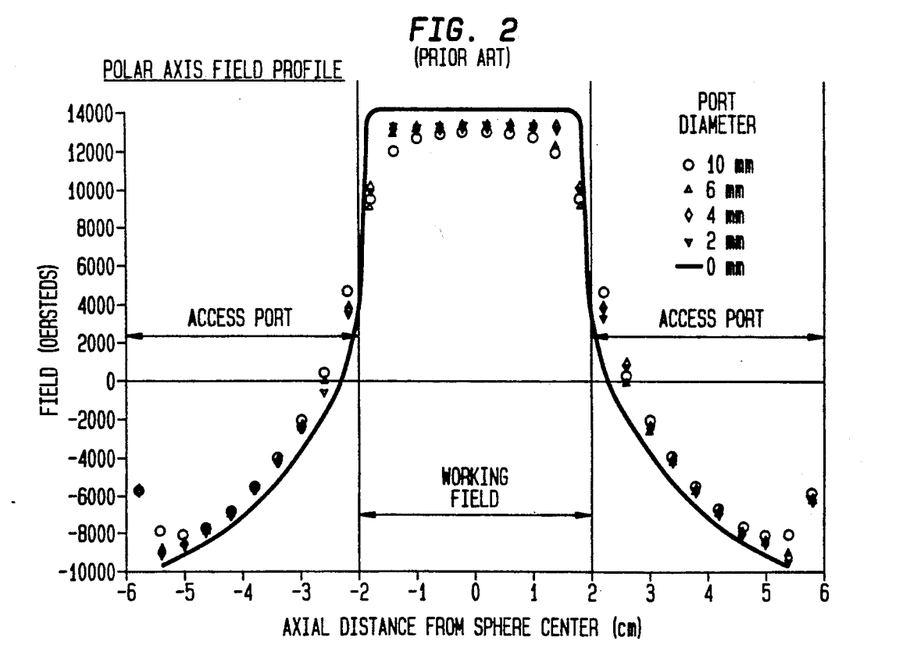
FIG. 2 is a graph useful in understanding the performance of a prior-art magnet similar to the FIG. 1 magnet.

FIG. 2 shows a typical polar axis field profile for a segmented spherical magnet similar to magnet 20 with different diameters for ports 23. It can be seen that the working field has significant uniformity. While in absolute terms this field is not appreciably distorted with the addition of access ports 23, the small distortions shown in the FIG. 2 graph can be intolerable in some applications.

Figure 3:
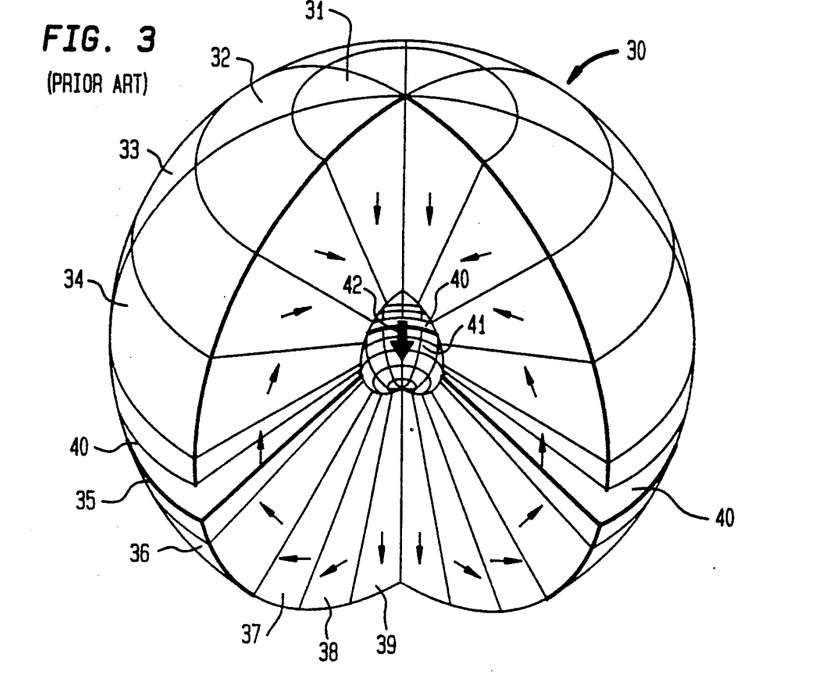
FIG. 3 is a pictorial view, with a ninety-degree section removed to reveal the inner cross section, of another embodiment of a prior-art magnet of a "magic-sphere" type.

FIG. 3 illustrates a segmented "magic-sphere" type magnet 30 that is more practical to fabricate than the ideal magnet 20. As mentioned above, because the magnetization in the ideal case continuously varies in direction, magnet 20 is difficult to fabricate. Segmented magnet 30 is fabricated from a plurality of nested segments each of which has a magnetization that is constant in both magnitude and direction. Clearly, it is easier to fabricate a magnetic segment having a uniform magnetization than it is to fabricate a one-piece spherical magnet whose magnetization varies continuously.

Magnet 30 is comprised of a series of nested cones 31–39. Disregarding an access port 40 for the moment, polar cones 31, 39 are solid and the series of nested cones 32–38 have the appearance of conical shells with a spherical cavity 41. Considering cone 32, by way of example, it is readily seen to be a shell having inner and outer spherical surfaces and nesting surfaces that are conical. While nine cones are depicted in FIG. 3, magnet 30 might comprise a fewer or larger number. Of course, the larger the number of cones, the closer magnet 30 approximates ideal magnet 20 (FIG. 1). It is noted that magnet 30 is composed of seventy-two segments and that a ninety-degree portion composed of eighteen segments is not shown in FIG. 3.

Cones 31–39 are segmented along equally spaced meridians. It can be seen that each cone is comprised of eight similar segments (two segments of each cone are not shown). Although cones 31–39 are illustrated as being segmented into eight segments each, they can comprise a fewer or greater number of segments: the greater the number of segments, the closer the approximation is to the ideal configuration.

As mentioned above, the magnetization in each of the segments of cones 31–39 is constant throughout in both magnitude and direction. However, the magnetization from segment to segment varies in direction with the average polar angle of its cone. It has been found that even with as few as eight cones per sphere and eight segments per cone, more than ninety percent of the field of the ideal structure is obtainable.

If a field of twenty kilo-oersteds (kOe) is desired in cavity 41 (see arrow 42) with a diameter of 1.0 centimeter, and if the magnetic material of cones 31–39 has a remanence of twelve kilogauss, the outer diameter of magnet 30 need be only 3.49 centimeters. The structure would weigh about 0.145 kilogram, an extraordinarily small mass for so great a field in that volume.

Figure 4:
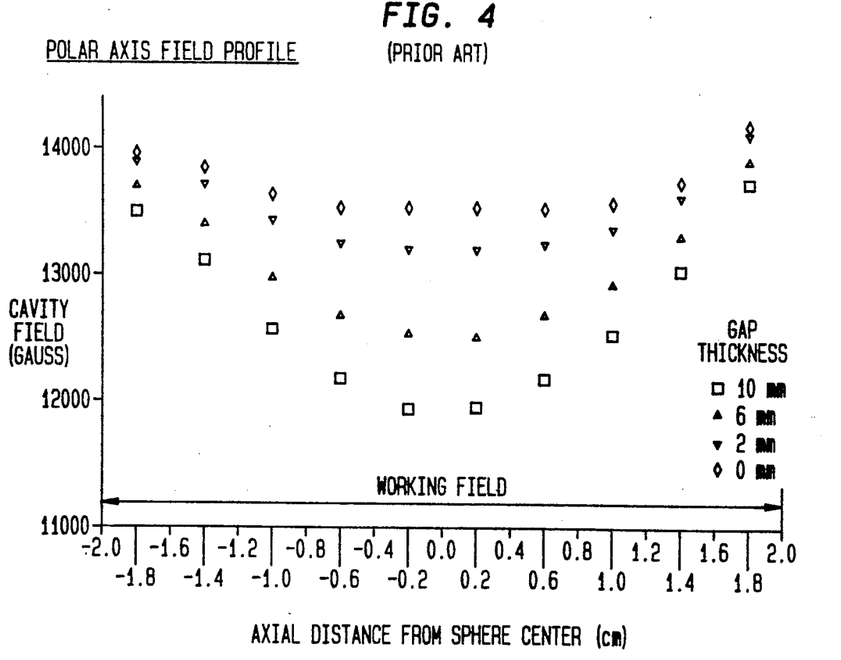
FIG. 4 is a graph useful in understanding the performance of a prior-art magnet similar to the FIG. 4 magnet.

Access port 40 is a narrow, ring-shaped gap that passes through the segments of the equatorial cone 35, dividing the magnet 30 into substantially equal hemispheres. Port 40 permits access to cavity 41 in a direction transverse to the working field (arrow 42). The addition of access port 40 will, like access ports 23, inflict a distortion on the working field in cavity 41. However, in this case the field distortion is more severe. FIG. 4 is a graph which shows a field profile on the polar axis for a typical spherical magnet similar to magnet 30. Compared to the field profile in FIG. 2, it can be seen that the working field here has significant distortions.

Figure 5:
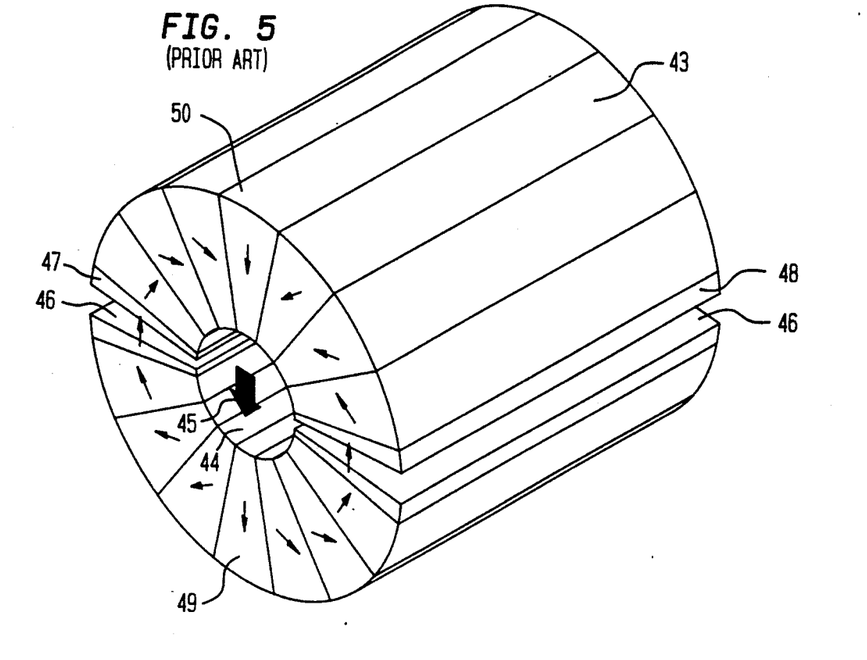
FIG. 5, which shows still another prior-art embodiment, is a pictorial view of a cylindrical magnet of a "magic-ring" type.

FIG. 5 illustrates a prior-art magnet 43 shaped as a "magic ring." Magnet 43 has a plurality of segments that are nested to form a cylindrical shell with a concentric cylindrical cavity 44. Disregarding coplanar access ports 46, the segments are all similarly shaped. Also, each segment is uniformly magnetized in a plane perpendicular to the cylindrical axis of magnet 43. From segment to segment, the magnetization varies with and twice that of a polar angle, where the cylindrical axis is the pole. A thick arrow 45 represents a substantially uniform working field in a working space of cavity 44. Access to cavity 44 may be reached via the open ends of magnet 43 or via access ports 46.

Access ports 46 are narrow gaps that lie in the plane of the longitudinal axis of cylindrical magnet 43. Ports 46 pass through the center of opposed segments 47, 48. Ports 46 communicate with cavity 44 on opposite sides thereof. In the particular example of FIG. 5, the plane of access ports 46 is aligned perpendicular to the working field (arrow 45). In many applications, it is necessary to locate access ports 46 in segments 49, 50 so that they are aligned parallel to the working field. In the FIG. 5 configuration, access ports 46 inflict a significant, unwanted distortion on working field 45 in cavity 44.

In summary, prior-art permanent magnets having access ports that pass through a magnetic shell and communicate with a cavity do not produce working fields of sufficient uniformity for many applications. In the present invention, however, the magnetization configurations of permanent magnets of the type described above are oriented so that distortions of the working fields due to the presence of access ports are significantly reduced.

Figure 6:
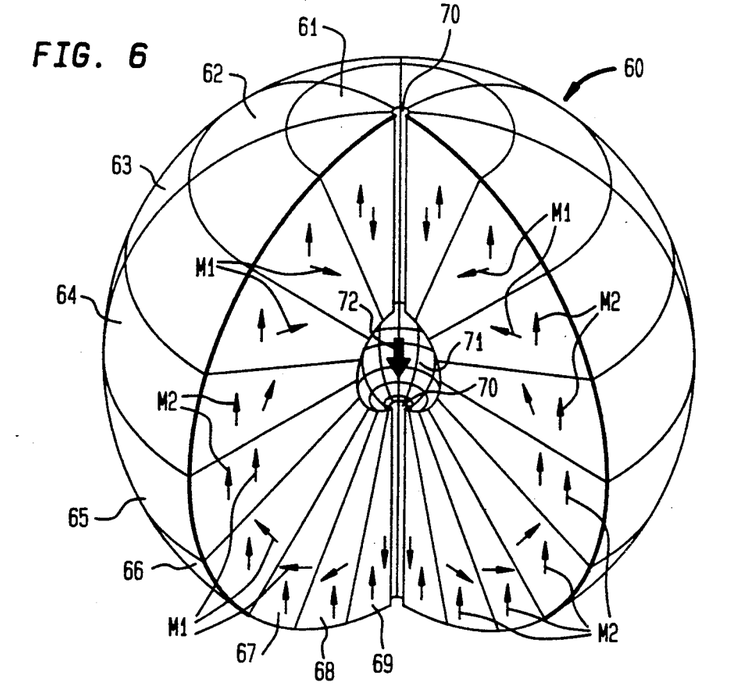
FIG. 6 is a pictorial view, with a ninety-degree section removed to reveal an inner cross section, of a magnet of a "magic-sphere" type made in accordance with the present invention.
Figure 8:
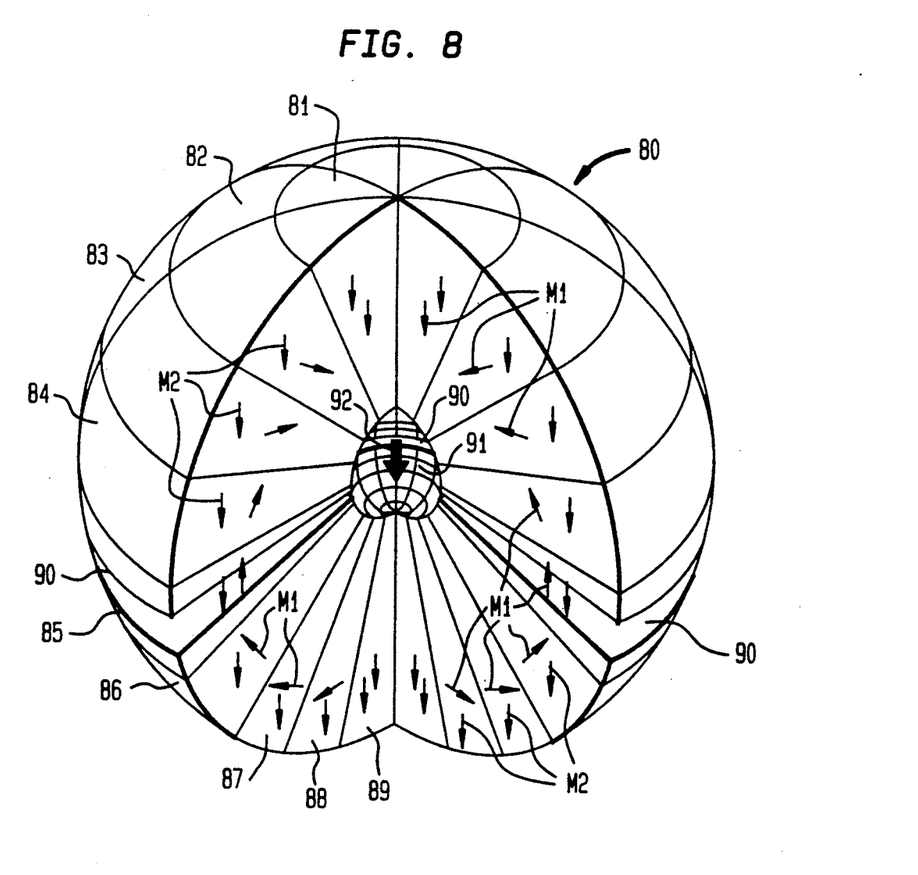
FIG. 8 is a pictorial view, with a ninety-degree section removed to reveal an inner cross section, of a second embodiment of a magnet of a "magic-sphere" type made in accordance with the present invention.
Figure 11:
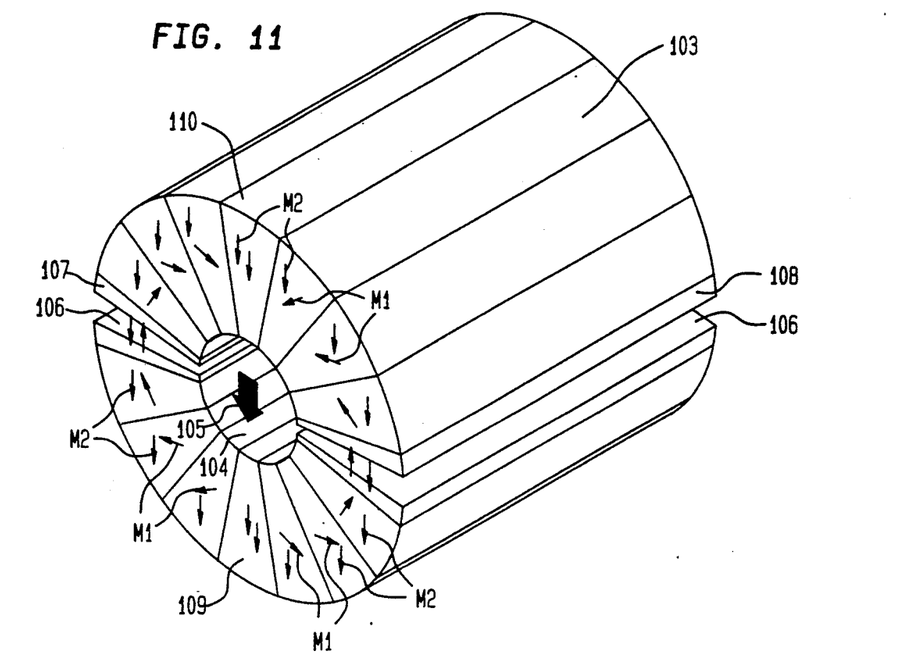
FIGS. 11 and 12 are pictorial views of still other embodiments of magnets of a "magic-ring" type made in accordance with the present invention.
Figure 12:
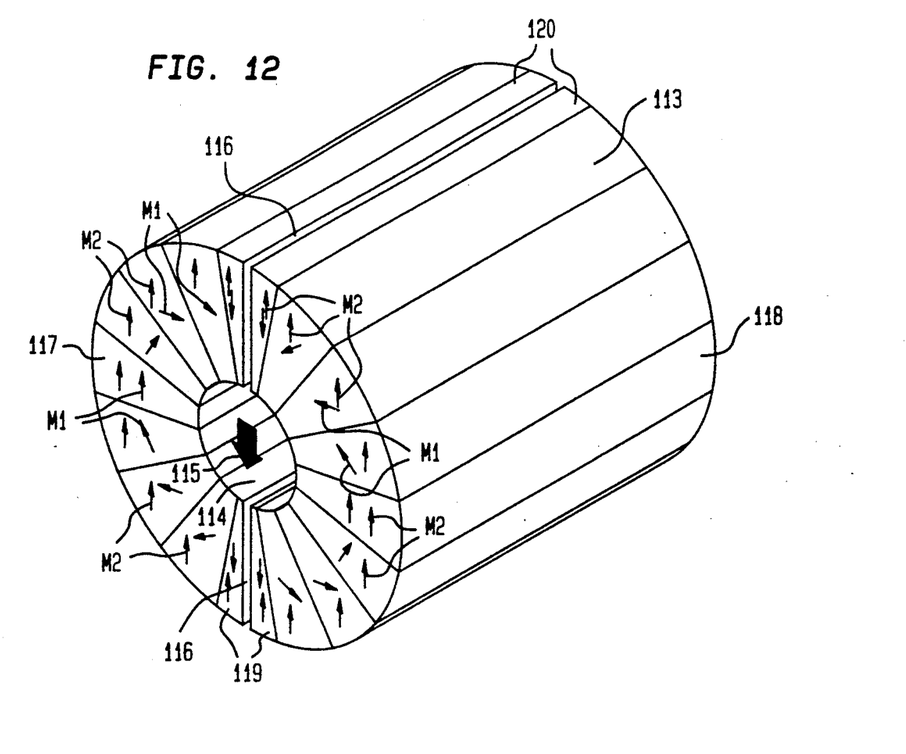

Generally, magnetization configurations in magnets made in accordance with the present invention are such that the intensity and polarization directions vary throughout the magnet. The magnetization intensity varies such that it is substantially zero in the regions adjacent the access ports. FIGS. 6 and 8 show "magic-sphere" type magnets, and FIGS. 11 and 12 show "magic-ring" type magnets made in accordance with the present invention.

FIG. 6 shows a segmented "magic-sphere" type magnet 60 having narrow, cylindrical access ports 70 that are axially aligned on opposite sides of magnet 60 along a polar axis. Magnet 60 comprises a series of nested cones 61–69. Disregarding ports 70, polar cones 61, 69 are solid and the series of nested cones 62–68 have the appearance of conical shells with a spherical cavity 71 which houses a uniform working field (see arrow 72). Magnet 60, which is similar in shape to magnet 30 of FIG. 2, is made up of nine cones 61–69 which are each made up of eight segments for a total of seventy-two segments, eighteen of which are not shown.

Figure 7:
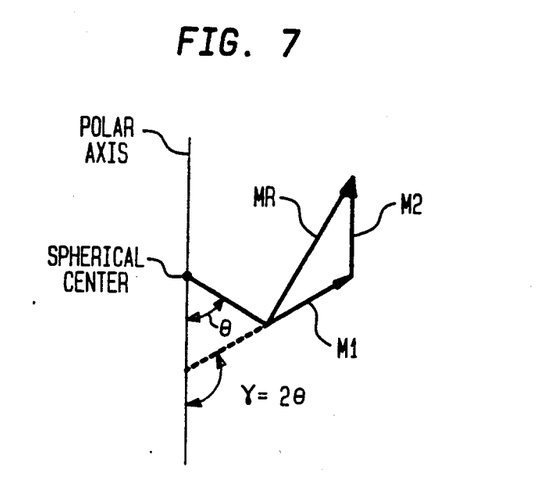
FIG. 7 is a graph showing a vector addition of magnetization components that is useful in understanding the concepts of the present invention.

The magnetization configuration for magnet 60 is such that resultant magnetization MR in each segment is the vector sum of two components M1 and M2, as illustrated in FIG. 7. The magnetization MR in each segment of magnet 60 is uniform, but varies from segment to segment. Magnetization components M1 are constant in magnitude throughout the magnet 60. The direction of components M1 varies from segment to segment as a function of an average polar angle $\gamma$ for its cone, where the longitudinal axis of ports 70 is the polar axis and the spherical center of magnet 60 is the pole. With the downward direction considered to be the zero polar-angle direction, the angular orientations of components M1, in terms of their polar angles $\gamma$, vary with average polar angles $\theta$ in accordance with equation (1) as follows:

$$\gamma = 2\theta \quad (1)$$

A detailed mathematical description of the remanence characteristics for a "magic sphere" is given in the Leupold '542 patent, cited above.

The magnitudes and directions of the magnetization components M2 are the same in each segment of magnet 60 and are chosen such that there is substantially zero magnetization in the regions adjacent ports 70. Specifically, in the segments of polar cones 61, 69, components M2 are chosen to be equal in magnitude and opposite in direction to components M1. As such, resultant magnetization MR for these segments is zero since components M1 and M2 cancel each other.

To summarize, components M1 and M2 are equal in magnitude throughout magnet 60. Components M1 vary in direction (angle $\gamma$) twice that of average polar angle $\theta$. Components M2 are uniform throughout magnet 60.

Consequently, the combined effect of components M1 is to produce a uniform working field in cavity 71. Because components M2 are uniform, no magnetic field is produced in cavity 71 by these components. Also, since components M1 and M2 cancel in cones 61, 69, there is no remanence in these regions, which is the equivalent of having no magnetic material in these regions. As such, removal of this material to provide access ports 70 has no effect on the magnetic field in cavity 71. Also for the same reason, the uniformity of the working field (arrow 72) produced by components M1 is unaffected by the addition of access ports 70.

FIG. 7 illustrates a typical vector sum for components M1 and M2. Those skilled in the art will see that resultant magnetizations MR vary in magnitude from zero, when M1 and M2 are anti-aligned, to a maximum value, when M1 and M2 are aligned. The maximum value of MR is twice the magnitude of component M1. As such, when comparing magnet 60 with a corresponding conventional magnet, it is seen that the maximum resultant magnetization MR in magnet 60 must be twice the size of the maximum magnetization in the conventional magnet to produce the same size working fields.

For example, if components M1 of magnet 60 are equal to the magnetization vectors of magnet 30 before making access ports 40 and 70, the working fields in cavities 41 and 71 are substantially equal. The addition of components M2 to produce magnet 60 permits the making of access ports 70 without distorting the working field (arrow 72). As stated above, the making of access ports in a conventional "magic sphere," such as ports 40 in magnet 30 of FIG. 3, results in distorting the working field.

When obtaining the beneficial effects of adding components M2, the maximum magnetization required to build a corresponding magnet is doubled. Specifically, components M1 and M2 in the segments of cone 65 (see FIG. 6) are equal in both magnitude and direction. As such, the resultant magnetization MR in cone 65 is a maximum for magnet 60 and is twice the size of the individual components M1 and M2. Also, this maximum magnification MR is twice the size of the magnetization vectors of a corresponding conventional magnet such as magnet 30. However, it is again noted that the working field (arrow 72) in magnet 60 after ports 70 are made will have the uniformity and intensity of a working field in a corresponding conventional magnet before the ports are made.

FIG. 8 illustrates a variation of a "magic-sphere" type magnet 80 in which a wedge-shaped access port 90 is centered about an equatorial plane. Magnet 80 consists of a plurality of magnetic segments arranged as a series of nested cones 81–89 to form a spherical shell with a concentric spherical cavity 91. Access port 90 consists of a ring-shaped gap that passes through the center of the segments of cone 85, thereby substantially dividing magnet 80 into two hemispheres.

Resultant magnetization MR of magnet 80 is the resultant of the vector sum of components M1 and M2. Components M1 are equal in magnitude and vary in orientation (angle $\gamma$) twice that of average polar angle $\theta$. Components M2 are equal in magnitude and direction for all segments. Also, components M2 are equal in magnitude to components M1. In the segments of cone 85, components M1 and M2 are oppositely directed.

Consequently, resultant magnetizations MR in the segments of cone 85, which houses access port 90, are zero because components M1 and M2 cancel. Also, because components M2 are uniform throughout magnet 80, they produce no internal magnetic field and, therefore, have no effect on the working field in cavity 91. Further, because there is substantially no magnetic remanence in the segments of cone 85, removing material from these segments to form access port 90 has no effect on the working field in cavity 91. As such, the working field (arrow which is determined by the combination of components M1, is of substantial uniformity.

It is noted that the maximum magnetization intensity is located in cones 81, 89 where components M1 and M2 are aligned. The maximum magnetization intensity is equal to twice that of components M1.

Figure 9:
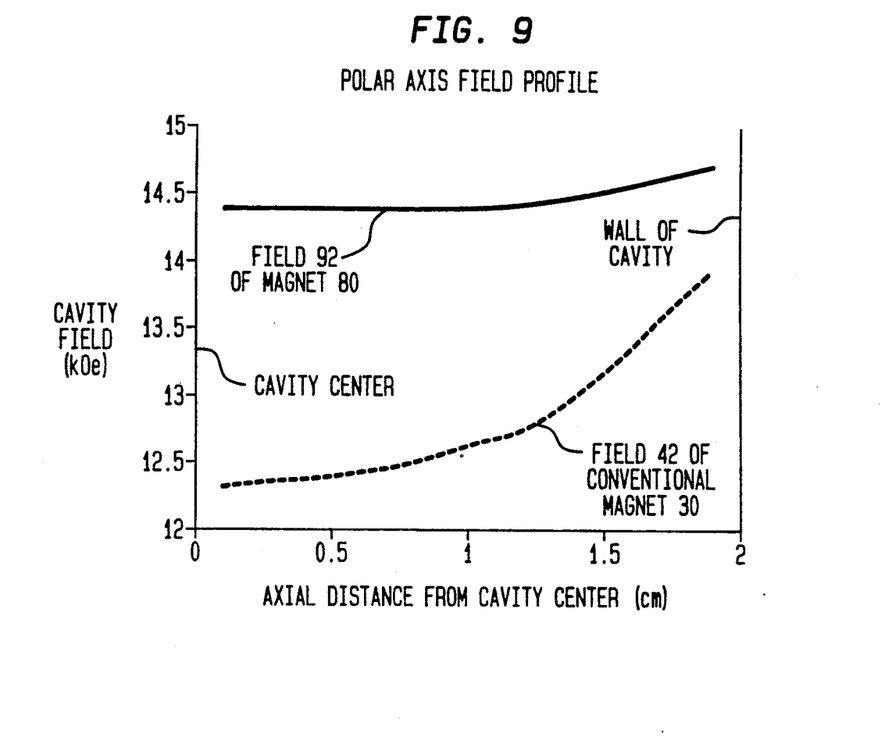
FIGS. 9 and 10 are graphs useful in comparing magnetic-field profiles of the magnets shown in FIGS. 3 and 8.
Figure 10:
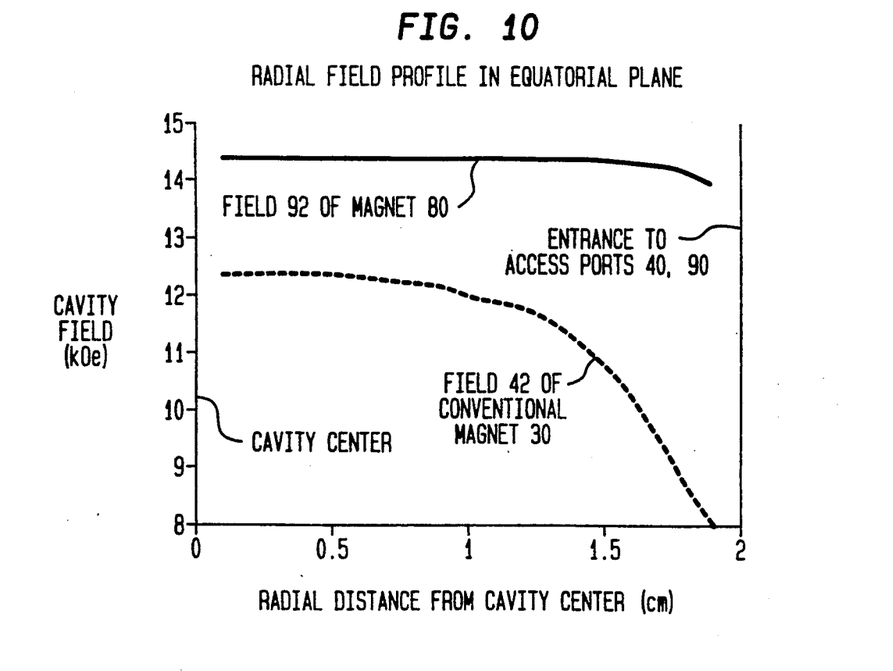

FIGS. 9 and 10 are graphs that compare typical results achieved using the above-described technique on a prior-art magnet, such as magnet 30 of FIG. 3, to achieve spherical magnet 80. FIG. 9 shows axial-radial profiles and FIG. 10 shows equatorial-radial profiles for magnetic field 92 (solid lines) as compared to corresponding profiles (broken lines) for magnetic field 42 of the conventional magnet 30 (see FIG. 3). As these graphs demonstrate, magnetic field 92 is substantially more uniform in both the axial and equatorial directions than its corresponding field 42 of magnet 30. It is noted again, however, that the maximum remanence in magnet 80 is twice that in magnet 30.

FIGS. 11 and 12 illustrate "magic-ring" type magnets that use a similar technique for providing non-distorting access ports. FIG. 11 shows a magnet 103 having a plurality of similarly shaped, nested segments which form a cylindrical shell with a concentric cylindrical cavity 104 in which a uniform magnetic field is located (arrow 105). A pair of wedge-shaped access ports 106 pass through the center of opposed segments 107, 108. Ports 106 are centered about a plane that is perpendicular to the working field (arrow 105) in cavity 104.

Resultant magnetizations MR in magnet 103 vary in magnitude and direction from segment to segment. Resultant magnetizations MR are the vector sums of magnetization components M1 and M2, which are all equal in magnitude and lie in planes that are perpendicular to the cylindrical axis. Components M1 and M2 in segments 107, 108 are anti-aligned. As such, resultant magnetizations MR in segments 107, 108 are zero and the introduction of access ports 106 has no appreciable effect on the uniformity of the working field in cavity 104 (arrow 105).

Resultant magnetizations MR in segments 109, 110 is a maximum and equal to twice that of components M1. As in the previously described embodiments, the magnetization of the segments will vary from zero to a maximum.

FIG. 12 depicts a magnet 113 having a plurality of similarly shaped, nested segments which form a cylindrical shell with a concentric cylindrical cavity 114 in which a uniform magnetic field is located (see arrow 115). A pair of coplanar access ports 116 pass through opposed segments 119 and 120. Ports 116 lie in a plane that is parallel to the working field (arrow 115) in cavity 114.

The resultant magnetizations MR vary in magnitude and direction from segment to segment. The resultant magnetizations MR are the vector sums of magnetization components M1 and M2, which are all equal in magnitude and lie in planes that are perpendicular to the cylindrical axis. Components M1 and M2 in segments 119, 120 are parallel but oppositely directed. As such, the resultant magnetizations MR in segments 119, 120 are zero and the introduction of access ports 116 has no appreciable effect on the uniformity of the working field in cavity 114 (arrow 115).

Resultant magnetization MR in segments 117, 118 is a maximum and equal to twice that of components M1. As in the previously described embodiments, the magnetization of the segments will vary from zero to a maximum.

Obviously many other modifications and variations of the present invention are possible in the light of the above teachings. For example, the inventive technique may be readily applied to a variety of other flux sources that have a shell of magnetic material and an inner cavity. Those skilled in the art will find it obvious, in the light of the above teachings, to employ the inventive technique when designing toroidal magnets or hemispherical magnets. Still further, the uniformly magnetized components M2 need not be in the axial direction, but can be applied at any polar angle to eliminate any magnitization in any segment of the magnetic shell. It is therefore to be understood, that within the scope of the appended claims, the invention may be practiced otherwise than as specifically described.

I claim:
1. A permanent magnet structure comprising:
a shell of magnetic material having a hollow cavity, a central axis and an access port that passes through said shell and communicates with said cavity, said shell being permanently magnetized to produce a uniform magnetic field in said cavity such that the magnetization of said shell is the resultant vector sum of magnetization components M1 and M2, said components M2 are uniform in magnitude and direction, said components M1 are uniform in magnitude and nonuniform in direction, wherein the direction of components M1 vary as a function of an average polar angle $\theta$ as follows: $\gamma=2\theta$, where $\gamma$ is the polar angle of said components M1, wherein said components M1 and M2 are substantially equal in magnitude to each other, and wherein the resultant vector sum of the magnetization of components M1 and M2 at said access port is 0.

2. The magnet of claim 1 wherein said shell comprises a plurality of magnetic segments and wherein each said segment is uniformly magnetized.

3. The magnet of claim 2 wherein said shell and said cavity are concentric spheres.

4. The magnet of claim 3 wherein said access port includes an axial hole that passes through the spherical center of said shell.

5. The magnet of claim 4 wherein said magnetization components M2 are aligned parallel to said polar axis.

6. The magnet of claim 3 wherein said access port includes a narrow, ring-shaped gap that passes through said shell at its equatorial plane.

7. The magnet of claim 6 wherein said magnetization components M2 are aligned parallel to said polar axis.

8. The magnet of claim 2 wherein said shell and said cavity are concentric cylinders.

9. The magnet of claim 8 wherein said access port is a narrow gap, and said gap lies in a plane that includes the cylindrical axis of said shell.

10. The magnet of claim 9 wherein said magnetization components M2 are aligned perpendicular to the plane of said gap.

11. The magnet of claim 9 wherein said magnetization components M2 are aligned parallel to the plane of said gap.

* * * * *